United States Patent [19]
Ranjan

[11] Patent Number: 5,861,657
[45] Date of Patent: *Jan. 19, 1999

[54] GRADED CONCENTRATION EPITAXIAL SUBSTRATE FOR SEMICONDUCTOR DEVICE HAVING RESURF DIFFUSION

[75] Inventor: Niraj Ranjan, El Segundo, Calif.

[73] Assignee: International Rectifier Corporation, El Segundo, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 783,667

[22] Filed: Jan. 15, 1997

Related U.S. Application Data

[60] Provisional application No. 60/010,162 Jan. 18, 1996.
[51] Int. Cl.$^6$ .................................................. H01L 23/58
[52] U.S. Cl. .......................................... 257/492; 257/493
[58] Field of Search ..................................... 257/492, 493

[56] References Cited

U.S. PATENT DOCUMENTS

| | | | |
|---|---|---|---|
| 4,111,720 | 9/1978 | Michel et al. | 148/1.5 |
| 4,485,392 | 11/1984 | Singer | 257/493 |
| 4,729,964 | 3/1988 | Natsuaki et al. | 437/29 |

FOREIGN PATENT DOCUMENTS 2083700  3/1982  United Kingdom .

Primary Examiner—Mark V. Prenty
Attorney, Agent, or Firm—Ostrolenk, Faber, Gerb & Soffen, LLP

[57] ABSTRACT

The epitaxial substrate of a semiconductor chip device has a resurf diffusion in at least one of its isolated wells in the device chip surface. The wells are separated by junction diffusions. The thickness of the epitaxial layer is reduced by placing an increased percentage of its total charge for given a breakdown voltage (punch-through voltage) in the lower portion of the layer.

14 Claims, 5 Drawing Sheets

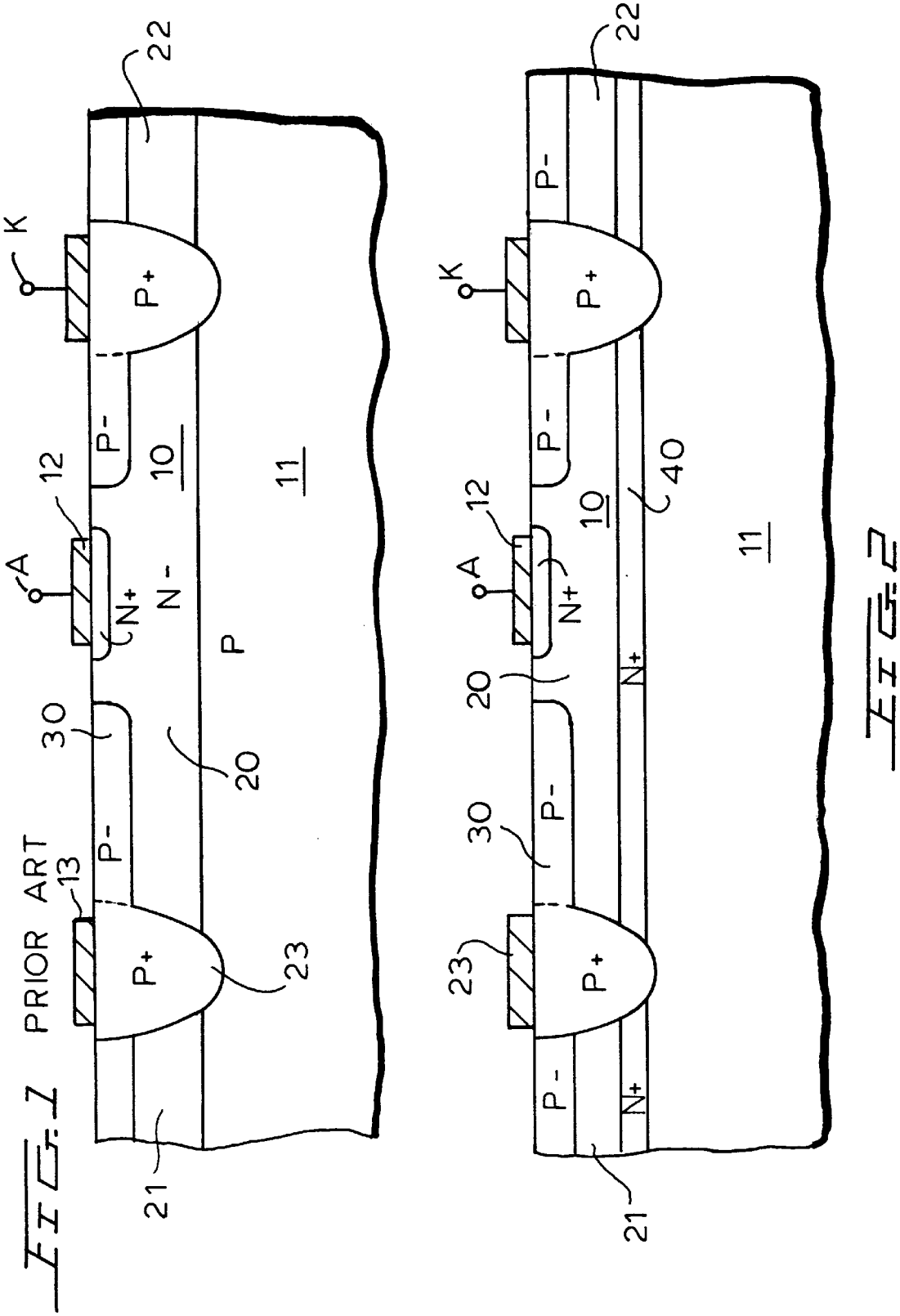

GRADED CONCENTRATION EPITAXIAL SUBSTRATE FOR SEMICONDUCTOR DEVICE HAVING RESURF DIFFUSION

RELATED APPLICATION

This application claims the priority of Provisional Application Ser. No. 60/010,162, filed Jan. 18, 1996.

FIELD OF THE INVENTION

This invention relates to semiconductor devices, and more specifically relates to a novel epitaxial substrate for receiving the junctions of a high voltage semiconductor device utilizing a double resurf technique.

BACKGROUND OF THE INVENTION

High voltage semiconductor devices commonly employ a resurf region which is a low concentration region between areas of high potential difference. The resurf region depletes as the voltage difference increases, and is fully depleted before the maximum voltage difference is applied. In the double resurf technique, there are two resurf regions of opposite polarities, both of which deplete as the applied potential difference increases. Such a device and the advantages of using the double resurf technique is detailed in U.S. Pat. No. 4,866,495.

In high voltage devices employing the double resurf technique, the resurf region of one polarity is created by implantation and diffusion of appropriate dopants into an epitaxially grown layer of opposite polarity. The epitaxial region pinched by the diffused resurf region serves as the second resurf region. High breakdown voltage is achieved when the charge in the top (diffused) resurf layer is controlled at approximately $1 \times 10^{12} cm^2$ and the charge in the lower (pinched epitaxial) resurf region is controlled at approximately 1.5 to $2 \times 10^{12} cm^2$. One outcome of such a construction is that as the depth of the diffused resurf layer varies slightly, the charge in the pinched epi region varies substantially so that control over breakdown voltage is lost. This effect has to be offset by using a thicker epitaxial layer. The thicker epitaxial layer has several drawbacks:

1. Deeper isolation diffusions are needed to electrically isolate different parts of the circuit on an integrated circuit from each other, requiring longer diffusion times at temperatures at or above 1200° C., resulting in lower throughput.

2. Very long diffusion times at 1200° C. or above, causes more defects resulting in lower yield.

3. The long diffusion times at 1200° C. or above also results in a wider isolation diffusion, due to greater lateral diffusion, thus reducing the amount of useful area on a chip.

BRIEF DESCRIPTION OF THE INVENTION

In accordance with the present invention, the thickness of the epitaxial layer is substantially reduced, but the charge distribution is modified. Thus, the majority (greater than about 75% and preferably greater than 80%) of the bottom resurf charge (pinched epi region) is contained in the bottom 1 to 4 microns of the epi or in about the bottom 25% or preferably 20% of the epi. The top portion of the epi is much more lightly doped and contains a very small portion of the bottom resurf charge.

The increased charge in the lower epitaxial region can be introduced ay the beginning of the wafer process by either of two means:

1. Through implantation of appropriate dopants into the substrate wafers followed by diffusion, prior to epitaxial growth of the lightly doped region.

2. Through an epitaxial growth process in which a thin heavily doped epitaxy is grown first followed by a thicker lightly doped epi growth.

In the resulting structure, a variation of the depth of top (diffused) resurf region will have a much smaller effect on the charge contained within the pinched region beneath it. This results in a better control over breakdown voltage with a much thinner epitaxial layer for a given breakdown voltage. The thinner epitaxial layer, in turn, reduces the diffusion processing time needed for forming isolation diffusions and the isolation diffusions have a smaller lateral extent and take up less chip area.

As another feature of the invention, the high temperature reverse bias characteristics of a completed device is substantially improved through the use of laterally spaced polysilicon rings in the insulation oxide in the device surface, and through the use of metallizing over the oxide covering the gate electrode to prevent contaminant ions from the plastic housing from drifting into the channel region.

Ruggedness of the completed device is improved through the use of spaced shorting bars which partially short an NMOS device in an N channel level shift device.

BRIEF DESCRIPTION OF THE DRAWINGS

FIG. 1 shows a cross-section of a portion of a chip containing a high voltage diode in an isolated well in a conventional prior art epitaxial layer.

FIG. 2 shows the manner in which the present invention redistributes charge in the epitaxial layer of FIG. 1, permitting the use of a thinner epitaxial layer and better control of breakdown voltage.

DETAILED DESCRIPTION OF THE DRAWINGS

Figure 3:
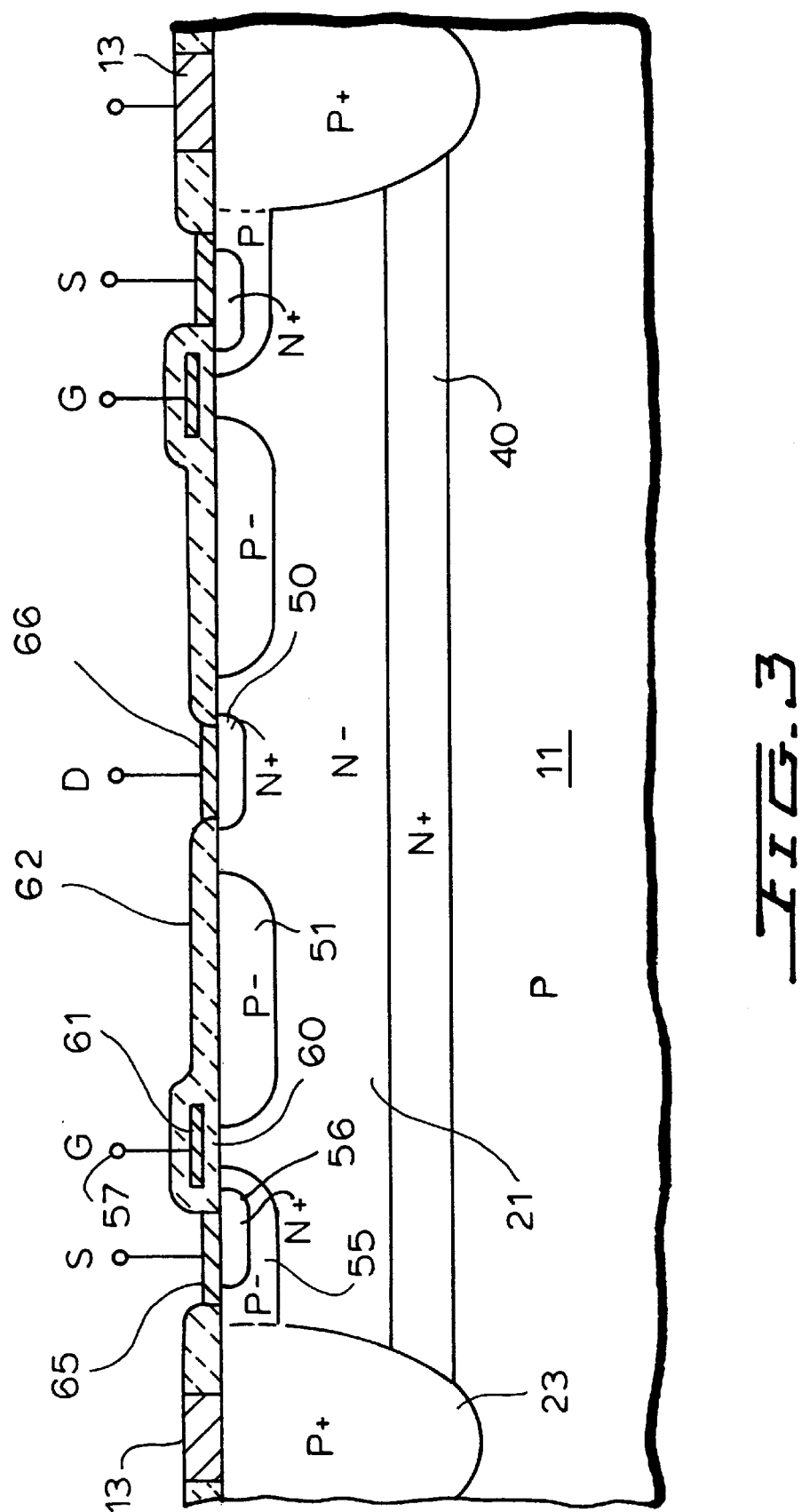
FIG. 3 shows the use of the invention for an N channel lateral conduction MOSFET which may be in another well of the chip of FIG. 2.

Referring first to FIG. 1, there is shown a prior art, horizontal conduction diode, the junctions of which are formed in an N⁻ well 10 of an N⁻ epitaxial layer of monocrystalline silicon, deposited atop a P type substrate 11. An N⁺ diffusion provides a low resistance contact to anode electrode 12 having terminal "A". Ring-shaped electrode 13 is the device cathode "K".

The epitaxial layer 10 (sometimes termed "epi") is divided into a plurality of isolated wells 20, 21 and 22 as by one or more P type isolation diffusions such as diffusion 23 which may be ring-shaped in topology, but can have any other desired topology. Cathode contact 13 is deposited atop P+ region 23. Diffusion 23 must be deep enough to intercept the P/N boundary between regions 10 and 11 in order to isolate regions or wells 20, 21 and 22. Wells 21 and 22 may contain any desired junction pattern, forming diodes, MOS-gated devices and/or bipolar devices in any desired discrete or integrated circuit configuration.

When the device of FIG. 1 is a high voltage device, for example, greater than 600 volts, a ring-shaped resurf P⁻ region 30 may be provided, which has a total charge of about $1 \times 10^{12}$ atoms/cm² and tends to fully deplete when the maximum reverse voltage is applied between the electrodes 12 and 13 of the diode. In order to prevent punch-through breakdown under reverse bias, the prior art epitaxial layer 10 for high voltage application, for example, 600 volts or greater, was made about 20 to 25 microns thick and had a uniform N⁻ resistivity measured at its surface of about 3 ohm cm.

As a result of the relatively thick epitaxial layer 10, the P type isolation diffusion 23 also becomes relatively wide due to lateral diffusion. This causes the diffusion 23 to occupy a relatively large portion of the total chip area, reducing the useful area of the various junction-containing wells. Furthermore, the thicker epitaxial layer 10 increases the cost of the wafer from which the individual chips (or die) are formed, increases processing time and causes additional damage due to the need for longer high temperature processing time.

Region 30 is typically about 5 microns deep. As this depth changes as due to manufacturing variance, the epi pinch beneath region 30 will have a major effect on the underlying charge, unless that charge concentration is reduced as by using a large epi volume beneath region 30.

In accordance with the present invention and as shown in FIG. 2, in which numerals similar to those FIG. 1 designate similar elements, the same total concentration of N carries in layer 10 of FIG. 1 is employed in FIG. 2, but is redistributed by putting a larger percentage of the total concentration in a small thickness portion 40 at the bottom of the epitaxial layer 10. For example, region 40 may have a thickness of from 10 to 40% of the total thickness of layer 10, but will have two to four time the concentration of layer 10. However, the combination of thickness and concentration of region 40 should result in a total charge 1.2 to $1.5 \times 10^{12}$ cm⁻² in this region. In the preferred embodiment of the invention, region 40 is 2 microns thick and has a doping concentration of about $7 \times 10^{15}$ cm⁻³.

By redistributing the total charge in region 10 as described above, the thickness of the epitaxial layer or region 10 is reduced substantially, for example, from 20 microns to 10 microns for a breakdown voltage of 600V. This then substantially reduces the depth needed for isolated diffusion 23, and thus its lateral area. Consequently, more area is preserved on the chip for active circuits or components. Furthermore, the time needed to dive the diffusion 23 is substantially reduced, for example, from 24 hours for a 20 micron thick epi to 6 hours for a 10 micron thick epi.

Finally, since only a small part of the part total charge in the pinched epi region under the resurf region 30 comes from the top portion of the epi (region 10), variation in the depth of region 30 will have a smaller effect on the charge in the pinched epi region.

The substrate 11 may be any conventional P-type substrate, and may a have thickness of from 5 to 25 mils. The resistivity of the substrate is chosen based on the breakdown voltage requirement. For example, for a 600V breakdown voltage, the substrate 11 resistivity is about 60 ohm cm. and for 1200V its resistivity is approximately 150 ohm cm.

The epi layer portion 40 for a 600 volt device is first grown with a relatively low resistivity, for example, 0.5 to 1 ohm cm. and a thickness of 1 to 4 microns. A combination of thickness and resistivity for region 40 is chosen such that the total charge is this layer is 1.2 to $1.5 \times 10^{12}$ cm⁻² resulting in an epitaxial sheet resistance of 3000 to 4000 ohms per square.

The relatively heavily doped region 40 (compared to region 10) can also be created by implanting phosphorus or arsenic ions directly into the P-type substrate 11 followed by diffusion to drive the dopants from 1 to 2 microns deep. The implants dose and drive-in diffusion conditions are chosen to achieve a sheet resistance of 3000 to 4000 ohms per square. The epi 10 is then grown atop the diffusion 40.

The thickness of the top epi layer (region 10) is chosen depending upon the depth of P⁻ resurf region 30 and the dopant species in the heavily doped region 40. For example, a thickness of about 8 microns is chosen for region 10, if the P⁻ resurf region 30 is approximately 5 microns deep and an arsenic dopant is used in region 40. It is possible to further reduce the top epi (region 10) thickness by reducing the P⁻ resurf region 30 thickness.

The resistivity of region 10 can be from 2 to 4 ohm cm., depending on the requirements imposed by other parts of the integrated circuit. The lower the resistivity of region 10, the more difficult it is to control the charge in the P⁻ resurf region 30. The selection of thickness and resistivity of the bottom epi pinched epi charge (under P⁻ resurf region 30) of 1.5 to $2.0 \times 10^{12}$ cm⁻¹² or a pinched epi sheet resistance of 2800 to 3500 ohms per square at the end of all processing steps.

The region 10 and its sub-region 40 may be either phosphorus or arsenic doped. Arsenic is preferred when thinner regions are desired, because arsenic has a lower diffusion coefficient that phosphorus and therefore has less auto-doping from the heavily doped region 40 into lightly doped region 10.

FIG. 3 shows how the present invention can be used when a lateral conduction MOSFET formed in well 21 of FIG. 2. Numerals similar to those of FIG. 2 designate similar parts. In FIG. 3, the junction pattern includes a control drain diffusion 50 surrounded by ring-shaped resurf diffusion 51. A ring-shaped P type base 55 containing a source ring 56 is diffused into the top surface of region 10. A suitable gate oxide 60 is formed under the polysilicon gate ring 61 and the entire surface of well 10 is covered by passivation oxide 62. Source electrode 65, which is ring-shaped, is connection to source 56 and base 55, and drain electrode 66 is connected to drain region 50. A gate electrode 57 is connected to polysilicon gate 61.

In operation, the structure of FIG. 3 will withstand a high reverse voltage between source electrode 65 and drain electrode 66, for example, 600 volts and above. To turn the device on, a voltage is applied to gate 61 which causes inversion of the channel region within base 55. Electron current can then flow from source electrode 65, through the inverted channel, under resurf diffusion 51 to drain 66.

It is to be noted that the junction pattern shown in FIG. 3 could be any other desired and known junction pattern, and could be cellular, interdigitated or the like.

In a 600 volt embodiment, the lateral distance from the outer edge of gate ring 61 to the edge of isolation diffusion 23 is about 25 microns. The gate ring 61 has a width of about 10 microns. The lateral distance between the inner edge of ring 61 to the outer edge of junction 50 is about 70 microns for a 600 volt device and about 140 microns for a 1200 volt device.

Substrate 11 is a 60 ohm centimeter boron-doped body which is 5 to 25 mils thick. Epitaxial layer 10 (measured from its upper surface to the of region 40) is 8 microns thick and has a resistivity of about 3 ohm cm. plus or minus about 10%. Region 40 has a thickness of about 2 microns and sheet resistance of 3000 to 4000 ohms per square. Regions 10 and 40 may be either phosphorus or arsenic doped. P⁻ resurf region 51 may have a depth of about 5 microns. Note that manufacturing variations in the 5 micron depth will have a small effect on the "epi pinch" beneath the region 51 since only a relatively small percentage of the total charge is in the pinch region.

In the case of a 1200 volt device, the above dimensions can be retained. However, the resistivity of the substrate is then increased from 60 to 150 ohm cm.

Figure 4:
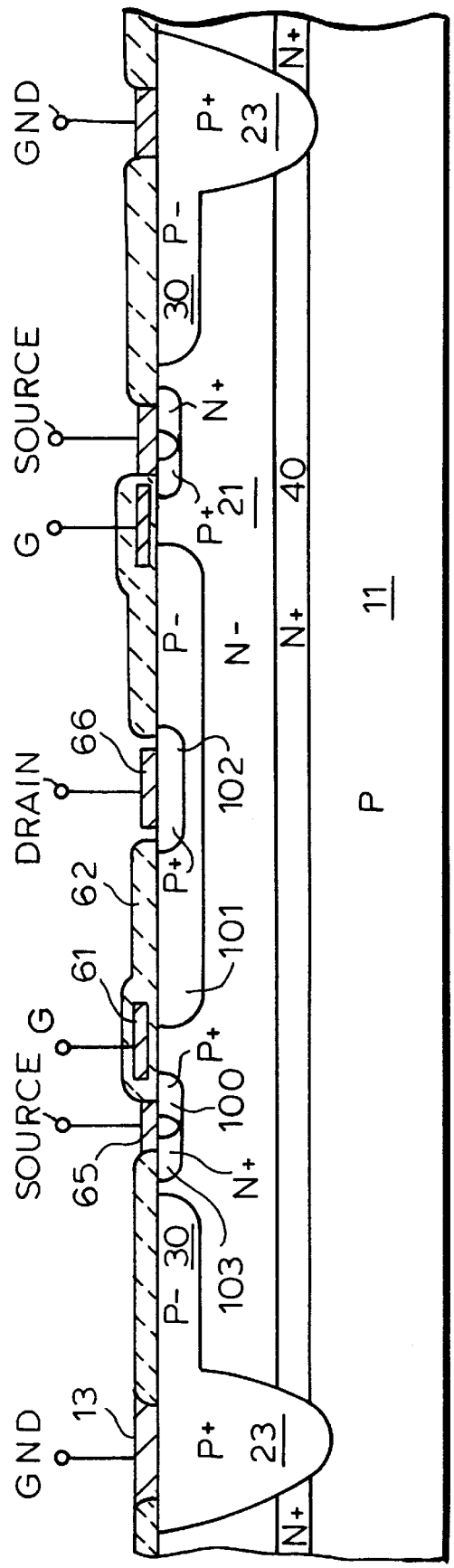
FIG. 4 shows the manner in which the invention can be implemented in a high voltage P channel MOSFET.

FIG. 4 shows the invention with a high voltage PMOS implementation. In FIG. 4, components which are similar to those of FIGS. 2 and 3 have the same identifying numerals. Thus, the structures of FIGS. 2 and 3 are combined, and gate 61 overlies the invertible channel between P⁺ region 100 and a central P⁻region 101. A central P⁺ contact region 102 is provided to contact drain contact 66. An N⁺ contact region 103 is also provided, in contact with the edge of region 100. Ground contact 13 is connected to P⁺ region 23.

Figure 5:
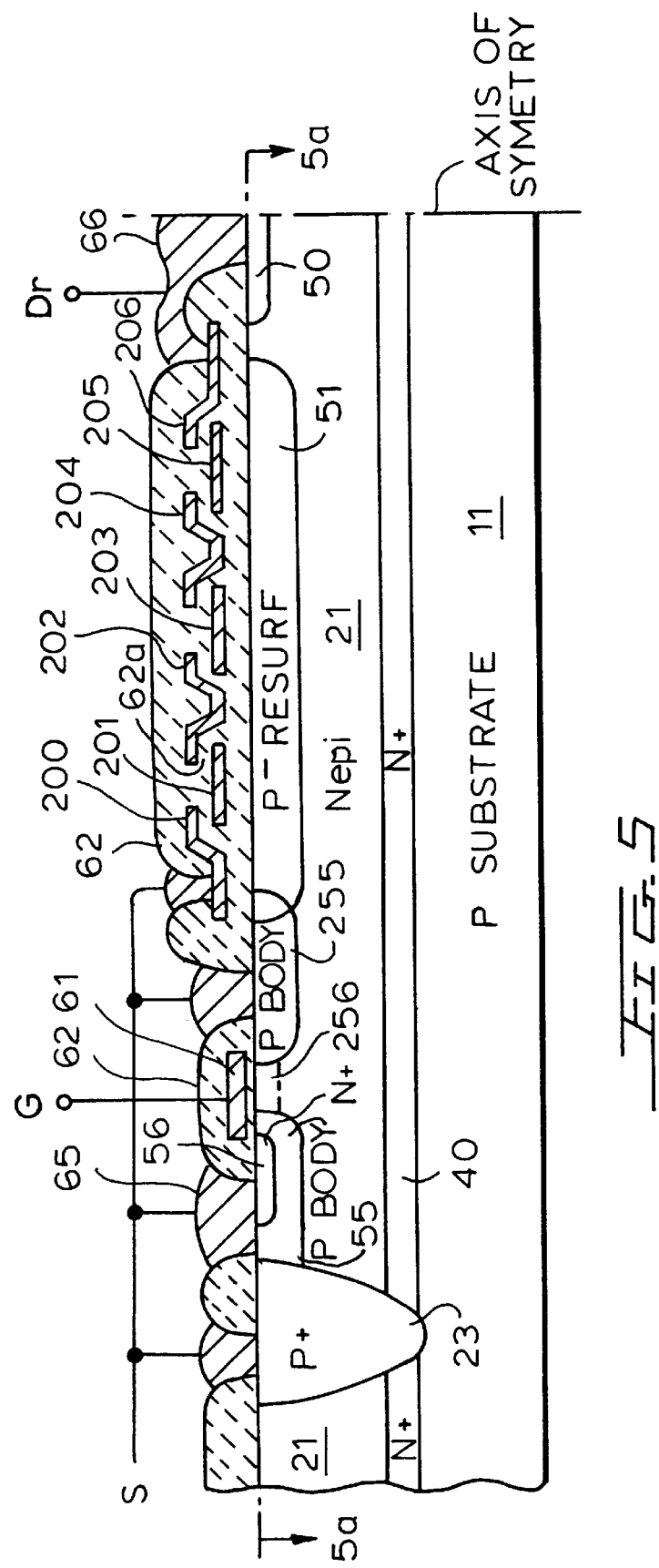
FIG. 5 shows a polysilicon ring structure, some rings of which are floating, for terminating the high voltage regions of the device of FIG. 3, and shows periodic shorts of the NMOSFET.

A passivation insulation region 62a may contain spaced polysilicon plates which help terminate the lateral electric field across the underlying silicon surface. FIG. 5 shows the left-hand half of FIG. 3 along with the added feature of overlapping capacitively coupled polysilicon rings which act as the means to terminate the high voltage between the source and drain electrodes 65 and 66.

Thus, as shown in FIG. 5, it was previously known to employ capacitively coupled polysilicon (poly) rings 200 to 206 (any desired number of rings can be used). The three rings labeled 201, 203 and 205 are put down on the first poly level and the other four rings labeled 200, 202, 204 and 206 are patterned on the second poly level. Both poly layers are doped to make them conductive. A dielectric layer 62a of approximately 500 nanometers is provided between the two poly layers to electrically isolate them from each other. Each successive ring on the second poly level overlaps the nearest rings on the first poly level by two to five micrometers, as shown in FIG. 5, to capacitively couple the rings to each other. The dielectric layer 62a can be created by thermal oxidation of the first poly layer or it can be a deposited silicon oxide or any other dielectric material such as silicon nitride. This dielectric must be capable of withstanding about 100 volts per single gap. Finally the whole structure is covered with passivation oxide 62.

The first ring 200 is connected to the source 65, or the lowest potential across the device and the last ring 206 which is connected to the highest potential of the device, or drain 66. The series of capacitively coupled poly rings divides the potential drop across the device into smaller discrete values, thereby reducing the tendency to concentrate the electric field near the surface of a high voltage device. This improves the breakdown voltage of the device. In addition, the proposed structure shields the surface of the high voltage device from stray electrostatic charges common in integrated circuits, due to ionic contaminants found in overlying plastic housing (not shown) in contact with the upper surface of the device of FIG. 5. The rings 200 to 206 dramatically improves the reliability of the high voltage device, especially when tested under High Temperature Bias (HTB) conditions.

The multiple ring structure can be used in lateral or vertical conduction high voltage devices such as diodes, MOSFETs IGBTs, BJTs and the like, and to both traditional and resurf type devices. The polysilicon rings can be replaced by any other conductors such as metals or silicides.

In accordance with a further feature the present invention, and as shown in FIG. 5, the floating ring termination structure is used in combination with a double resurf device of the type shown in FIG. 3 and 4.

Figure 5A:
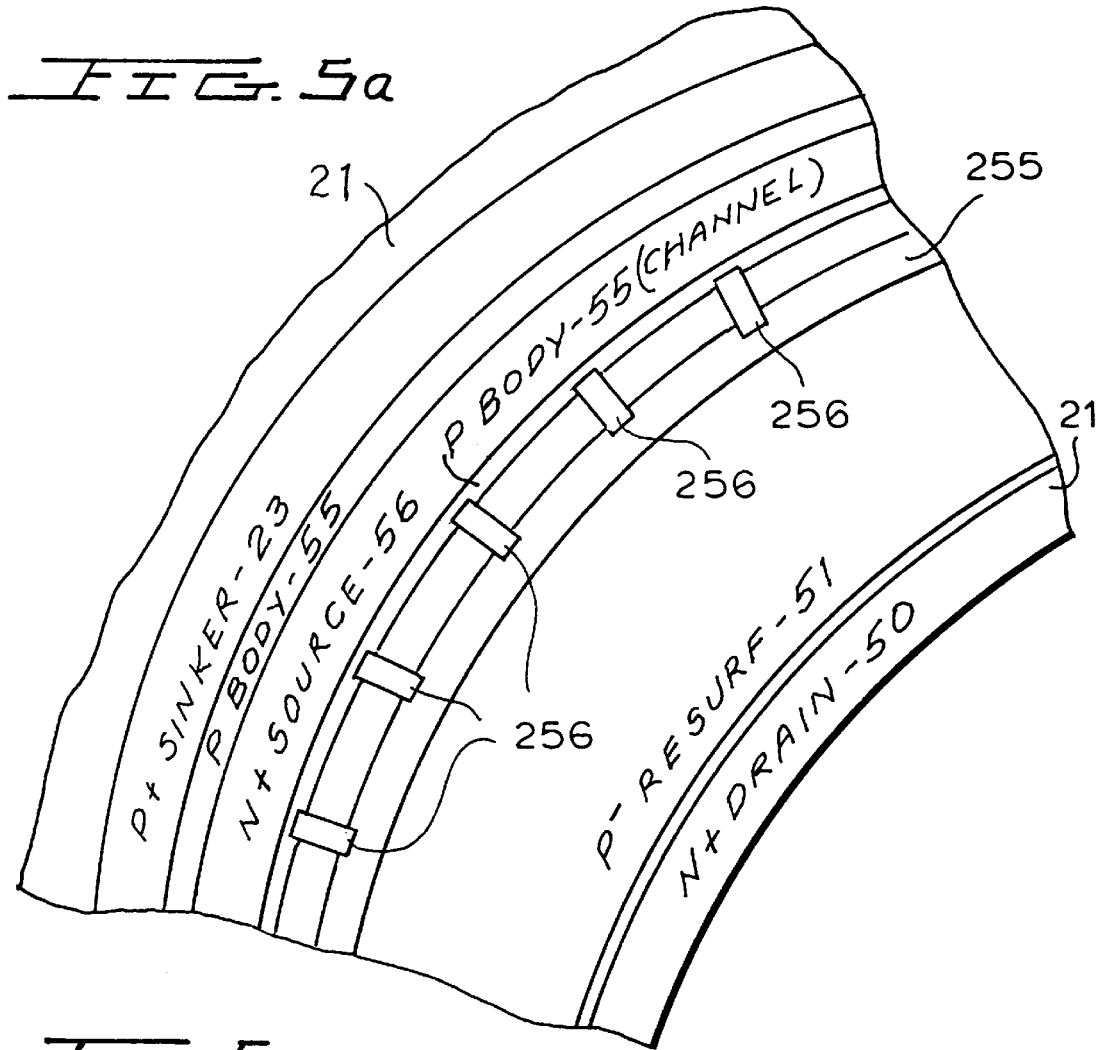
FIG. 5a is a plan view of FIG. 5.

FIG. 5 also contains a novel structure for making more "rugged" a level shift circuit, which may be employed in the chip. More specifically, a P type body ring 255 is diffused concentrically with the P type body 55 and it abuts the P⁻ resurf region 51. This forms an NMOSFET under gate 61. A plurality of spaced P type body sorts 256 then periodically short the P body 55 and P body 255 as shown in FIG. 5a.

The regions 256 short the N channel DMOSFET which reduces its total channel width. This reduces the device saturation current and can substantially increase device ruggedness.

Figure 6:
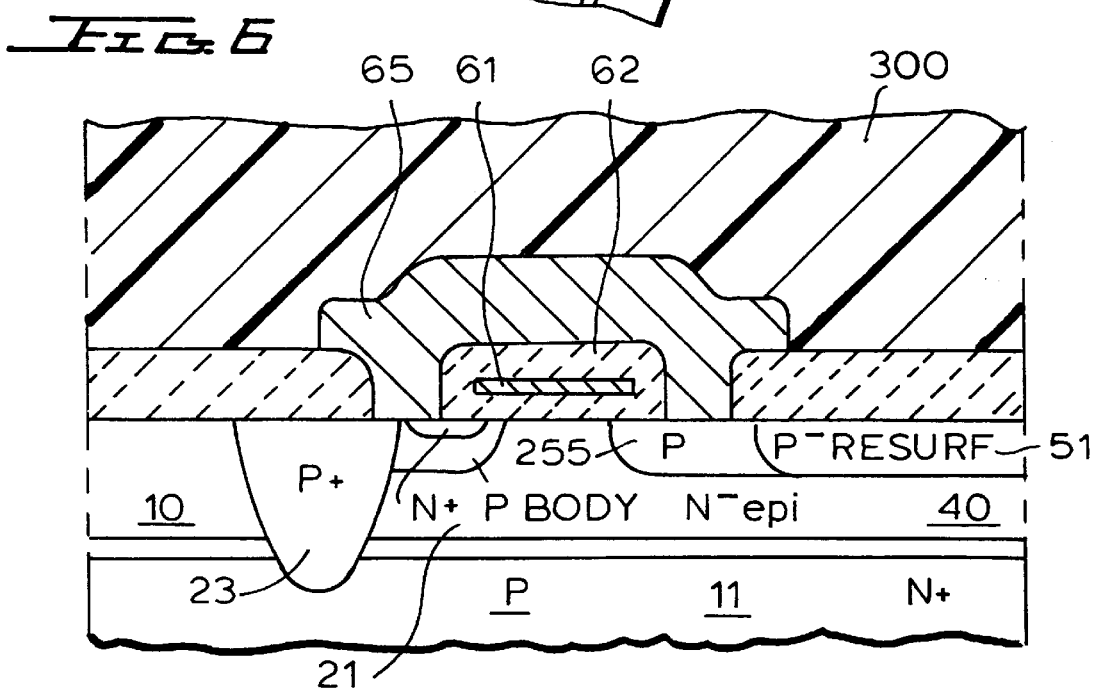
FIG. 6 is a cross-sectional view of a source contact bridge to prevent ionic contaminants from reaching the channel area.

FIG. 6 shows a further feature of the invention for providing an improved shield against ionic contaminants in the plastic housing cap 300. FIG. 6 also shows a small portion of FIG. 5, but adds thereto across the top of low temperature oxide 62 which is atop gate 61. More specifically, in prior art lateral devices, the source metal was cut or segregated as shown in FIG. 5 and did not extend over the top of the low temperature oxide 62 over gate 61. The channel region between P body 55 and source 56 is very sensitive to ionic contaminants. In accordance with a feature of the invention, the source metal 62 extends across the sensitive channel region to provide a physical metal (aluminum) shield against the migration of ionic contaminants formed in the plastic housing 300, especially at high temperature. Thus, the novel metal shield of FIG. 6 substantially improves the device characteristics under high temperature reverse bias (HTB).

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising a flat substrate of silicon having an epitaxial layer of monocrystalline silicon deposited thereon, said epitaxial layer having a given total charge carrier concentration therein; said epitaxial layer having a generally uniform thickness and a graded charge carrier concentration, whereby at least about 75% of the total charge carriers in said epitaxial layer is within a bottom portion comprised of a bottom 25% of the thickness of said epitaxial layer; said epitaxial layer having P–N junctions formed in an upper surface thereof; at least one of said junctions comprising a resurf junction having a depth substantially less than about 75% of the thickness of said epitaxial layer.

2. A semiconductor device comprising a flat substrate of silicon having an epitaxial layer of monocrystalline silicon deposited thereon, said epitaxial layer having a given total charge carrier concentration therein; said epitaxial layer having a generally uniform thickness, and a graded charge carrier concentration, whereby at least about 75% of the total charge carriers in said epitaxial layer is within a bottom portion formed in bottom 25% of the thickness of said layer; said epitaxial layer having P–N junctions formed in an upper surface thereof; and at least two isolation diffusions extending from said upper surface through said bottom portion and thereby separating at least one area of said bottom portion of said epitaxial layer from other areas thereof; said total charge carrier concentration being a function of a desired punch-through voltage for said epitaxial layer.

3. A semiconductor device comprising a flat substrate of silicon having an epitaxial layer of monocrystalline silicon deposited thereon, said epitaxial layer having a given total charge carrier concentration therein; said epitaxial layer having a generally uniform thickness, and a graded charge concentration, whereby at least about 75% of the total charge carriers in said epitaxial layer is within a bottom portion comprised of a bottom 25% of the thickness of said epitaxial layer; said epitaxial layer having P–N junctions formed in the upper surface thereof; at least one of said junctions comprising a resurf junction having a depth substantially less than about 75% of the thickness of said epitaxial layer; and at least two isolation diffusions extending from said upper surface through said bottom portion and separating at least one area of said bottom portion of said epitaxial layer from other areas thereof; said total charge carrier concentration being a function of a desired punch-through voltage for said epitaxial layer.

4. The device of claim 1 wherein said device has a voltage rating in excess of 600 volts, and wherein said epitaxial layer has a thickness of 10 microns.

5. The device of claim 4 wherein said at least 75% of the total charge of said epitaxial layer is within said bottom portion in less than about 1–4 microns of said epitaxial layer.

6. The device of claim 5 wherein said bottom portion of said epitaxial layer has a sheet resistance greater than about 3000 ohms per square, and wherein the sheet resistance of a remaining upper eight microns of said epitaxial layer is greater than about 4000 ohms per square.

7. The device of claim 2 wherein said device has a voltage rating in excess of 600 volts, and wherein said epitaxial layer has a thickness of about 10 microns.

8. The device of claim 3 wherein said device has a voltage rating in excess of 600 volts, and wherein said epitaxial layer has a thickness of about 10 microns.

9. The device of claim 7 wherein said at least 75% of the total charge of said epitaxial layer is within said bottom portion in less than about two microns of said epitaxial layer.

10. The device of claim 8 wherein said at least 75% of the total charge of said epitaxial layer is within said bottom portions in less than about two microns of said epitaxial layer.

11. The device of claim 9 wherein said bottom portion of said epitaxial layer has a sheet resistance greater than about 3000 ohms per square, and wherein the sheet resistance of a remaining upper eight microns of said epitaxial layer is greater than about 4000 ohms per square.

12. The device of claim 10 wherein said bottom portion of said epitaxial layer has a resistivity greater than about 3000 ohms per square, and wherein the resistivity of a remaining upper eight microns of said epitaxial layer is greater than about 4000 ohms per square.

13. The device of claim 4 wherein said resurf junction has a depth of about 5 microns.

14. The device of claim 8 wherein said resurf junction has a depth of about 5 microns.

\* \* \* \* \*